(12) United States Patent
Nakatani et al.

(10) Patent No.: US 7,083,740 B2
(45) Date of Patent: Aug. 1, 2006

(54) METHOD FOR MANUFACTURING RESONANT DEVICE

(75) Inventors: Masaya Nakatani, Hyogo (JP); Hirofumi Tajika, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 176 days.

(21) Appl. No.: 10/494,640

(22) PCT Filed: Aug. 20, 2003

(86) PCT No.: PCT/JP03/10492

§ 371 (c)(1),
(2), (4) Date: May 4, 2004

(87) PCT Pub. No.: WO2004/019426

PCT Pub. Date: Mar. 4, 2004

(65) Prior Publication Data

US 2005/0000934 A1    Jan. 6, 2005

(30) Foreign Application Priority Data

Aug. 21, 2002 (JP) ............................ 2002-240134

(51) Int. Cl.
*B34C 1/22* (2006.01)
(52) U.S. Cl. .................. 216/74; 216/75; 216/80
(58) Field of Classification Search .................. 216/74, 216/75, 80
See application file for complete search history.

(56) References Cited

U.S. PATENT DOCUMENTS

| 5,438,231 | A |   | 8/1995 | Khoshnevisan et al. |
| 5,498,312 | A | * | 3/1996 | Laermer et al. ............ 438/695 |
| 6,307,299 | B1 | * | 10/2001 | Suzuki et al. ............... 310/312 |
| 6,378,369 | B1 | * | 4/2002 | Takata et al. ............. 73/504.14 |
| 6,387,773 | B1 | * | 5/2002 | Engelhardt .................. 438/386 |
| 6,657,517 | B1 | * | 12/2003 | Barber et al. ............... 333/187 |
| 2003/0066350 | A1 | * | 4/2003 | Machida et al. ......... 73/504.15 |

FOREIGN PATENT DOCUMENTS

| EP | 1 302 744 | 4/2003 |
| JP | 2-187025 | 7/1990 |
| JP | 6-174739 | 6/1994 |
| JP | 11-111677 | 4/1999 |

* cited by examiner

Primary Examiner—Nadine G. Norton
Assistant Examiner—Binh X. Tran
(74) *Attorney, Agent, or Firm*—Wenderoth, Lind & Ponack, L.L.P.

(57) ABSTRACT

A piezoelectric member and an electrode are formed over a silicon substrate. The piezoelectric member and the electrode are patterned by photolithography. The silicon substrate is etched to form a body. A protective film is formed on at least one surface of the body. Another surface having no protective film thereon is etched to obtain a resonant device. The body is etched in its thickness direction accurately while a resonance frequency of the body is measured. The manufacturing processes allow the resonance frequency and a gap frequency of the resonant device to be adjusted to predetermined values.

20 Claims, 6 Drawing Sheets

METHOD FOR MANUFACTURING RESONANT DEVICE

TECHNICAL FIELD

The present invention relates to a resonant device utilizing mechanical resonance phenomena of substance, for use in, for example, acceleration sensors, angular velocity sensors, resonators, and filters.

BACKGROUND ART

U.S. Pat. No. 5,438,231 discloses an angular velocity sensor, a conventional resonant device which includes a body made of non-piezoelectric material, such as silicon, and having a tuning-fork shape, a lower electrode on the body, a piezoelectric member on the lower electrode, and plural upper electrodes on the piezoelectric member. A voltage applied between the lower electrode and the upper electrodes causes the tuning fork-shape body to vibrate. An angular velocity applied to the body from outside during the vibration displaces the body perpendicularly to a vibrating direction due to Coriolis force. The displacement generates a voltage between the upper electrodes and the lower electrode, and this voltage is measured as a displacement, hence allowing the angular velocity to be measured.

The angular velocity sensor including the body having the a tuning fork shape has respective resonance frequencies in a driving direction and a detecting direction of the body. The frequencies are close to each other and separated by a predetermined frequency in order to obtain a high driving efficiency and a high detection sensitivity. The resonance frequencies are determined by widths and thicknesses of arms of the tuning fork-shaped body. Those dimensions are required to be accurate with small errors thereof not more than ±1 μm.

To obtain dimensional accuracy, the body is processed in its width direction by photolithography and etching, and is processed in its thickness direction by machining. Those processes are important factors to determine absolute values of respective resonance frequencies in the width direction and the thickness direction of the body having the tuning fork-shape. Not only the absolute values of the resonance frequencies but also a difference between the resonance frequencies, i.e., a gap frequency needs to be determined to be a predetermined value.

Indexes indicating that they are the predetermined values are only shapes and dimensions of the arms, namely, widths and thicknesses of the arms while the body is processed. Therefore, it is difficult to measure actual resonance frequencies exactly. That is, it is difficult to use the gap frequency as an index for processing the body by the foregoing method.

SUMMARY OF THE INVENTION

A method of manufacturing a resonant device is provided. The method includes forming a piezoelectric layer and an electrode layer over a silicon substrate, forming a body by etching the silicon substrate, forming a protective film on a second surface of the body, etching the body, measuring a resonance frequency of the body during the etching, and controlling an amount of the etching based according to this measured resonance frequency.

According to this method, the etching is controlled while frequency characteristics are measured, thus providing a resonant device having a predetermined resonance frequency and a predetermined gap frequency, and having accurate coupling of vibration.

DETAILED DESCRIPTION OF THE PREFERRED EMBODIMENTS

Exemplary Embodiment 1

Figure 1:
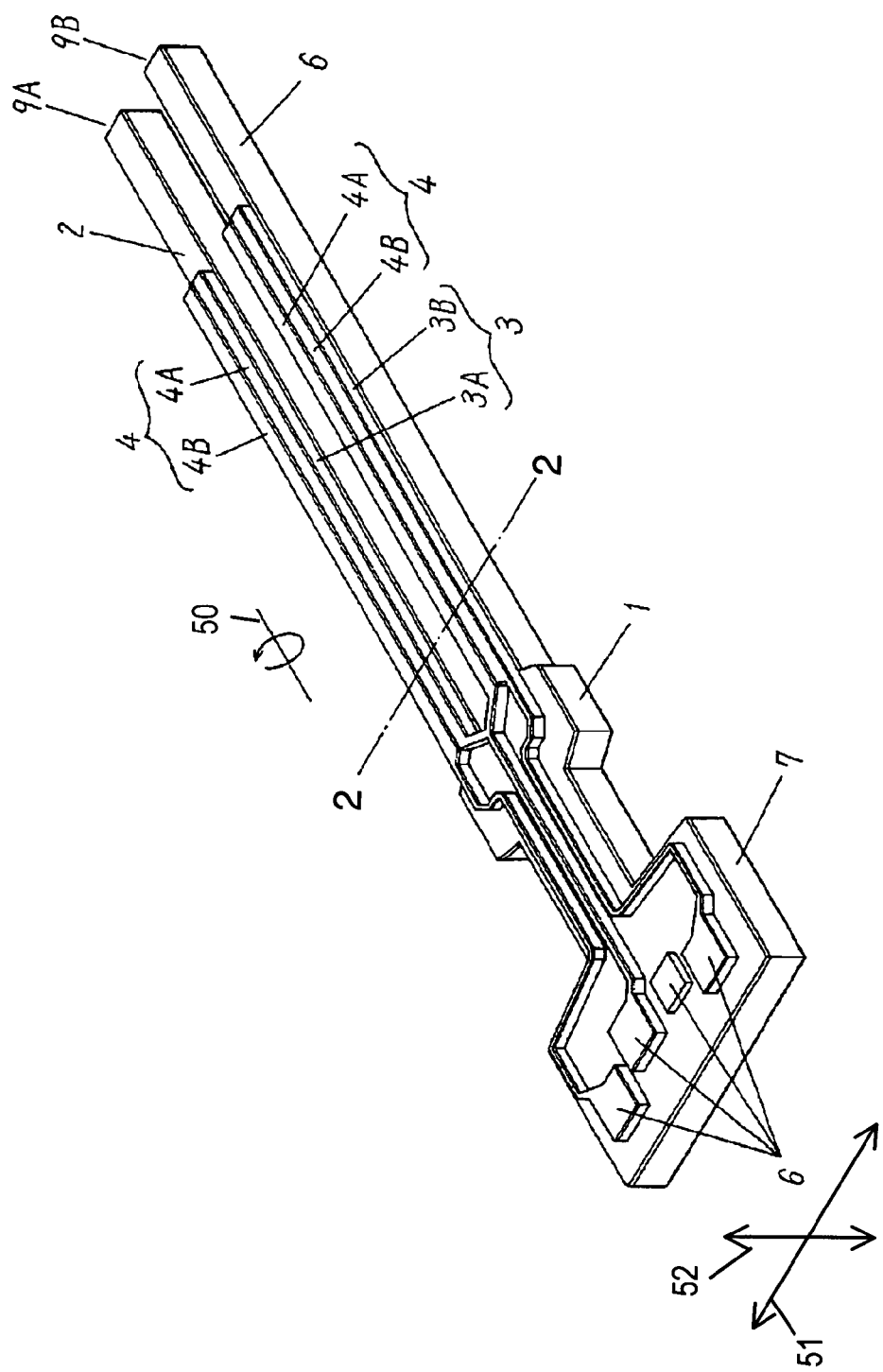
FIG. 1 is a perspective view of an angular velocity sensor, a resonant device in accordance with Exemplary Embodiments 1 to 3 of the present invention.

FIG. 1 is a perspective view of an angular velocity sensor, a resonant device in accordance with Exemplary Embodiments of the present invention. The sensor includes body 1 having a tuning-fork shape and made of silicon, lower electrode 2 on an upper surface of body 1 and made of platinum, driving piezoelectric member 3A and detecting piezoelectric member 3B on an upper surface of lower electrode 2 and made of lead zirconate titanate, driving electrode 4A on an upper surface of driving piezoelectric member 3A, and detecting electrode 4B on an upper surface of detecting piezoelectric member 3B. Lower electrode 2 and upper electrode 4 are connected to an exterior via lead-wires and electrode pad 6 on base 7 of body 1.

An operation of the angular velocity sensor will be described below with reference to FIG. 1. Upper electrode 4 is separated into driving electrode 4A and detecting electrode 4B. Driving piezoelectric member 3A is located between electrode 4A and lower electrode 2, and detecting piezoelectric member 3B is located between the electrode 4B and lower electrode 2. A voltage applied between driving electrode 4A and lower electrode 2 causes driving piezoelectric member 3A to expand and contract, thereby distorting arms 9A and 9B of body 1 having the tuning-fork shape. Thus, arms 9A and 9B vibrate in direction 51 parallel to a plane including the arms.

Rotational motion about rotational axis 50 parallel to arms 9A and 9B occurs while arms 9A and 9B vibrate, thus generating a Coriolis force to deflect arms 9A and 9B in direction 52 perpendicular to vibrating direction 51. This deflecting of the arms generates electric charges at detecting piezoelectric member 3B, and detecting electrode 4B detects the charges. In other words, the angular velocity sensor utilizes piezoelectric phenomenon and reverse voltage phenomenon of piezoelectric member 3 for driving arms 9A and 9B as well as detecting an angular velocity. Therefore, large displacements of arms 9A and 9B allow the angular velocity to be detected easily at a high sensitivity.

More specifically, a large amount of charges proportionate to the amount of the distortion of piezoelectric member 3A can be detected. This allows a driving frequency to be set close to a resonance frequency in a driving direction of body 1 having the tuning-fork shape. Then, an amount of displacement during driving increases, and thus increases a displacement due to angular velocity. As a result, the angular velocity can be detected easily. In order to obtain a large displacement of piezoelectric member 3B caused by angular velocity during the rotation, both resonance frequency in direction 51 for driving the arms and resonance frequency in direction 52 for deflecting the arms are preferably close to each other. If the frequencies are apart from each other, displacement of the arms due to the angular velocity hardly transmits in a detecting direction.

Figure 13:
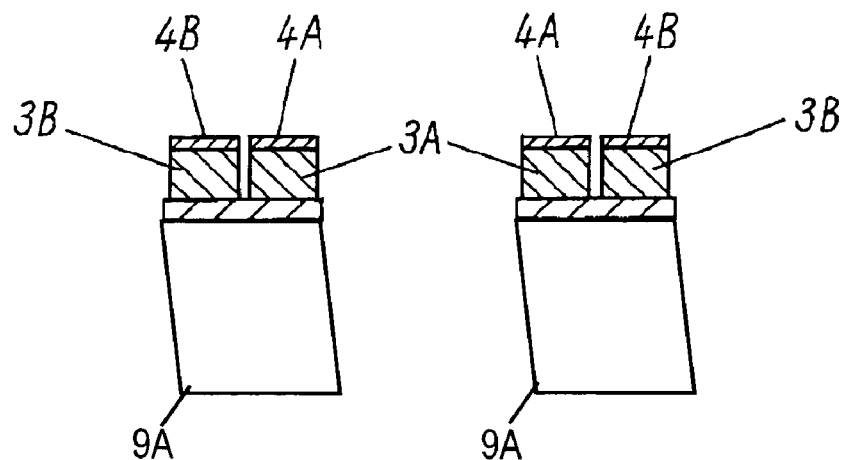
FIG. 13 is a sectional view taken along line 2—2 of FIG. 1, for illustrating processes of manufacturing another angular velocity sensor in of Embodiment 1.

However, if the resonance frequencies are too close to each other or identical to each other, respective vibrations in directions 51 and 52 are coupled. This coupling causes a displacement due to the angular velocity to be hidden behind resonance, hence preventing the displacement from being detected. In other words, the resonance frequencies need to be as close as possible while the vibrations are not coupled. For instance, if the resonance frequency in the driving direction is 20 kHz, the resonance frequency in the detecting direction is desirably about 19.8 kHz. A gap frequency, i.e., a difference between the frequencies is preferably not more than about 1% of the resonance frequencies. Meanwhile, the vibrations may be coupled due to shapes of arms 9A and 9B of body 1. This coupling may occur particularly if arms 9A and 9B have sections shaped as parallelograms, as shown in FIG. 13.

Figure 9:
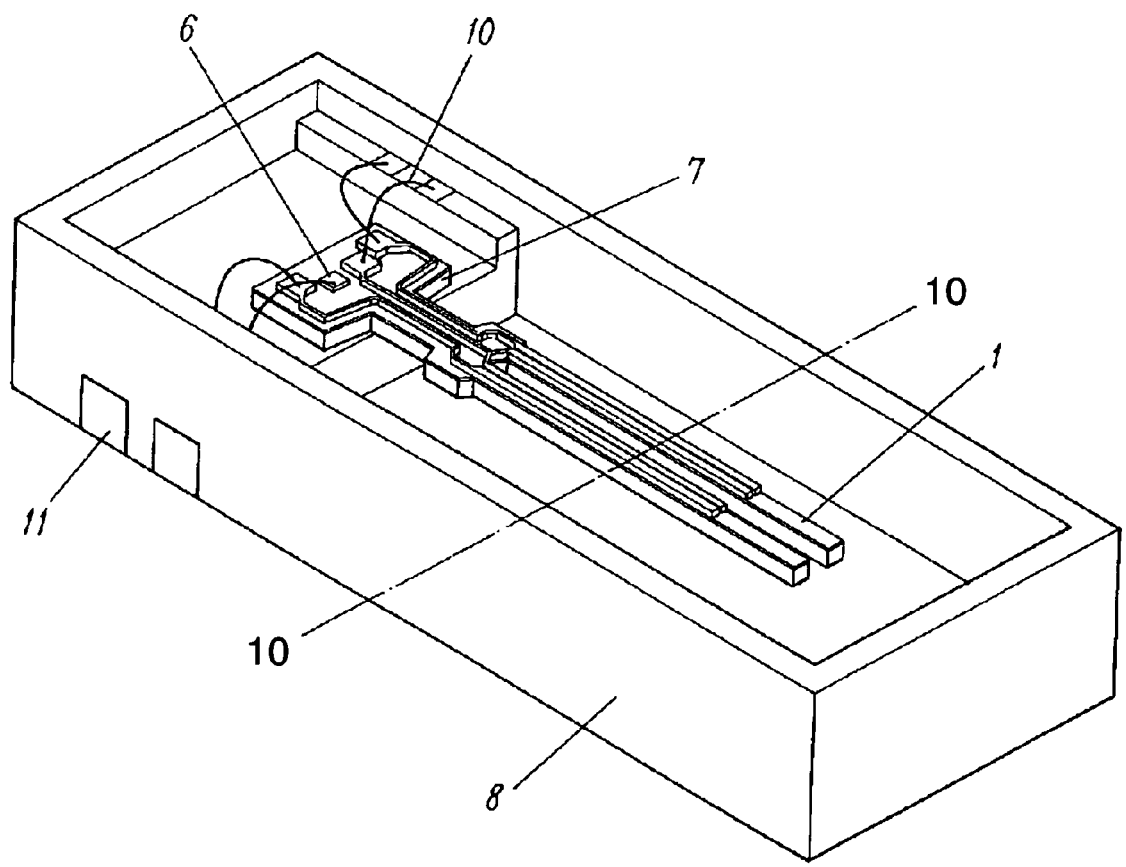
FIG. 9 is a perspective view of the angular velocity sensor mounted in a package in accordance with Embodiment 1.
Figure 10:
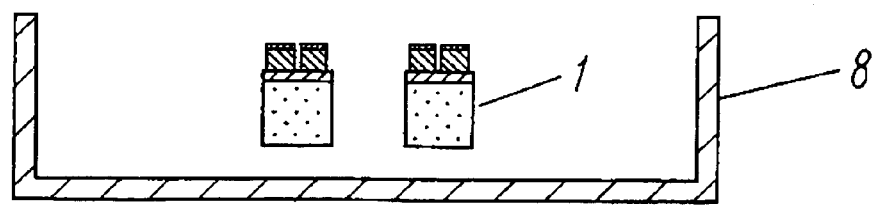
FIG. 10 is a sectional view taken along line 10—10 of FIG. 9, for illustrating processes of manufacturing the angular velocity sensor shown in FIG. 9.
Figure 11:
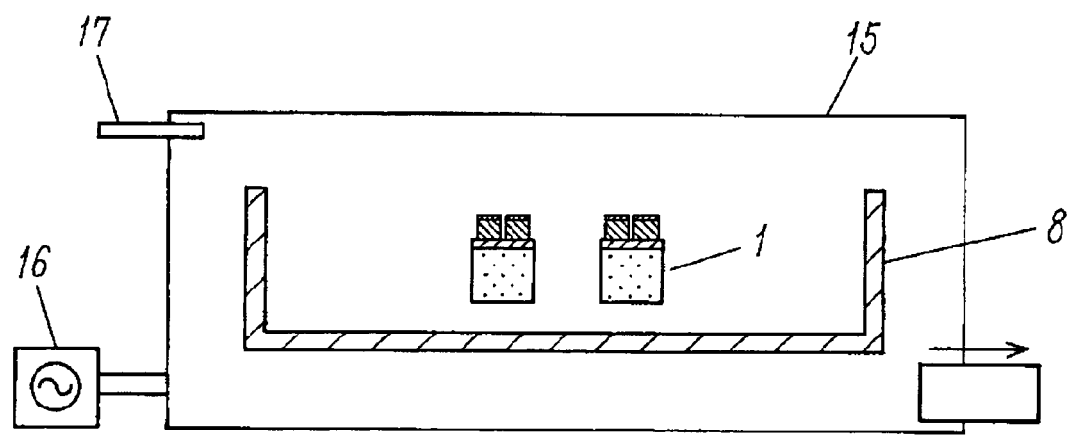
FIG. 11 is a sectional view taken along line 10—10 of FIG. 9, for illustrating the processes of manufacturing the angular velocity sensor shown in FIG. 9.
Figure 12:
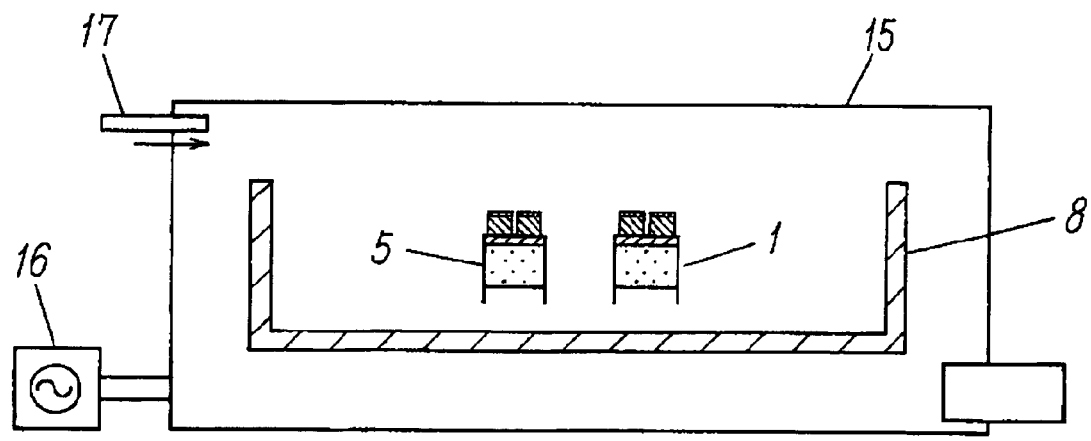
FIG. 12 is a sectional view taken along line 10—10 of FIG. 9, for illustrating the processes of manufacturing the angular velocity sensor shown in FIG. 9.

A method of manufacturing the angular velocity sensor will be described below with reference to FIGS. 2 to 12. FIGS. 2 to 8 are sectional views taken along line 2—2 of FIG. 1, for illustrating processes of manufacturing the angular velocity sensor of Embodiment 1. FIG. 9 is a perspective view of the angular velocity sensor mounted in a package according to Embodiment 1. FIGS. 10 to 12 are sectional views taken along line 10—10 of FIG. 9, for illustrating processes of manufacturing the angular velocity sensor shown in FIG. 9.

Figure 2:
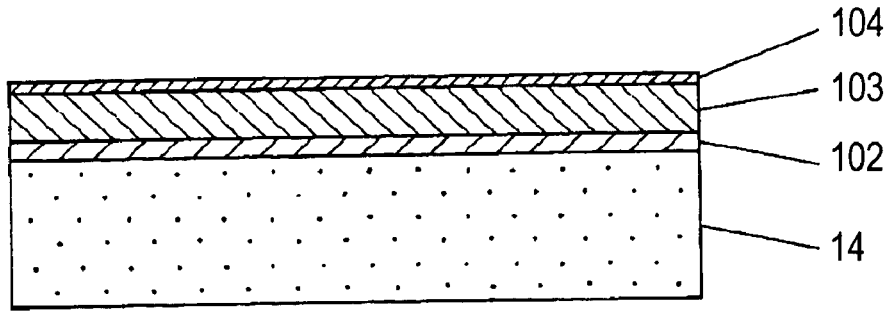
FIG. 2 is a sectional view taken along line 2—2 of FIG. 1, for illustrating processes of manufacturing the angular velocity sensor of Embodiment 1.

As shown in FIG. 2, platinum layer 102 to form lower electrode 2 is formed on silicon substrate 14 by sputtering. Then, lead-zirconate-titante layer 103 to form piezoelectric member 3 is formed on platinum layer 102 by sputtering, sol-gel process, or a hydrothermal synthesis method. Gold layer 104 to form upper electrode 4 is formed on lead-zirconate-titante layer 103 by an ordinary method for forming a thin film, such as sputtering method or vacuum deposition method.

Figure 3:
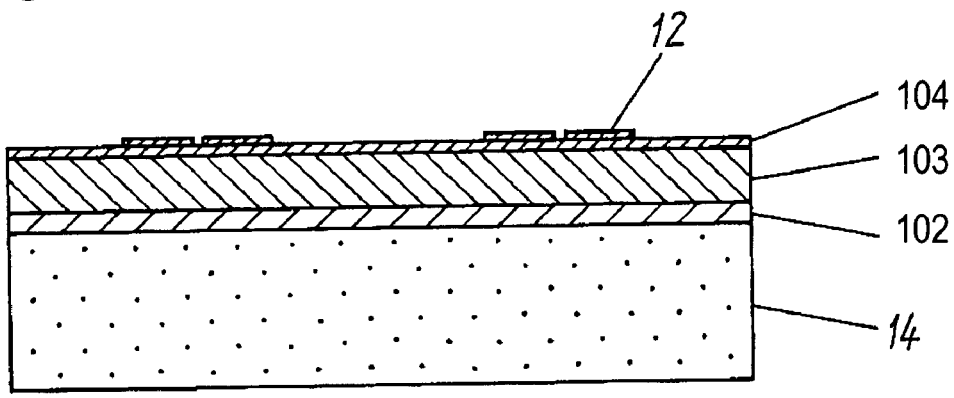
FIG. 3 is a sectional view taken along line 2—2 of FIG. 1, for illustrating the processes of manufacturing the angular velocity sensor of Embodiment 1.
Figure 4:
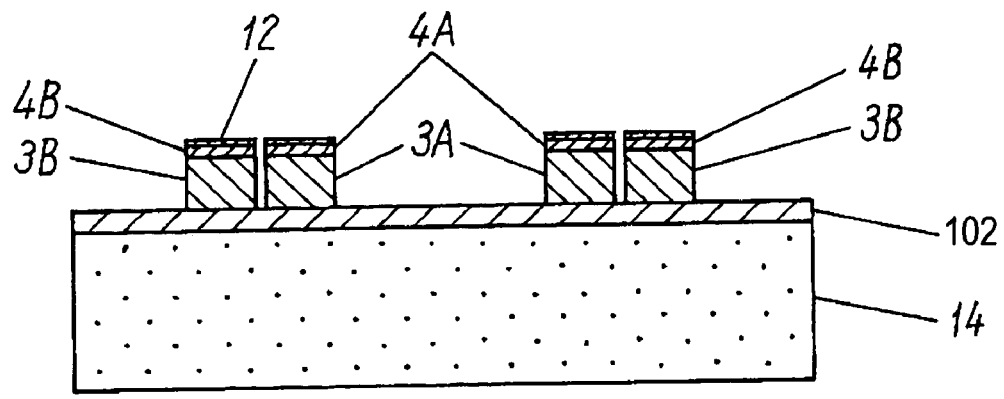
FIG. 4 shows a sectional view taken along line 2—2 of FIG. 1, for illustrating the processes of manufacturing the angular velocity sensor of Embodiment 1.

Next, as shown in FIG. 3, a pattern of resist mask 12 on gold layer 104 is formed by photolithography. Then, as shown in FIG. 4, gold layer 104 and lead-zirconate-titante layer 103 is etched to form electrode layers 4A and 4B and piezoelectric layer 3A and 3B. In order for upper electrode 4 and piezoelectric member 3 to be etched simultaneously with the same mask, the etching preferably causes little side-etch, hence employing dry-etching in this process. Upper electrode 4 is separated into driving electrode 4A and detecting electrode 4B, and piezoelectric member 3 is separated into driving piezoelectric member 3A and detecting piezoelectric member 3B in this process.

Figure 5:
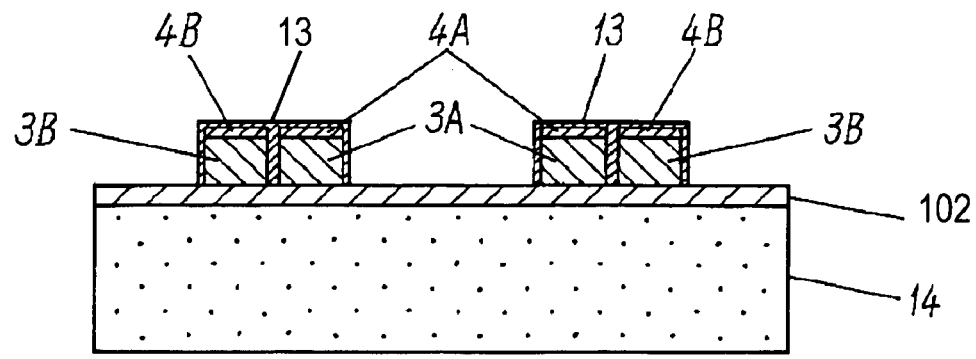
FIG. 5 is a sectional view taken along line 2—2 of FIG. 1, for illustrating the processes of manufacturing the angular velocity sensor of Embodiment 1.

Next, as shown in FIG. 5, resist mask 13 is provided on electrodes 4A and 4B and portions of platinum layer 102, and then, platinum layer 102 is etched, thereby providing lower electrode 2. Both dry-etching and wet-etching can be used in this process. If being dry-etched, platinum layer 102 is etched by an ordinary reactive-ion etching using $CF_4$ gas or Argon gas. If being wet-etched, platinum layer 102 is etched with a mixture solution of hydrochloric and nitric acid.

Figure 6:
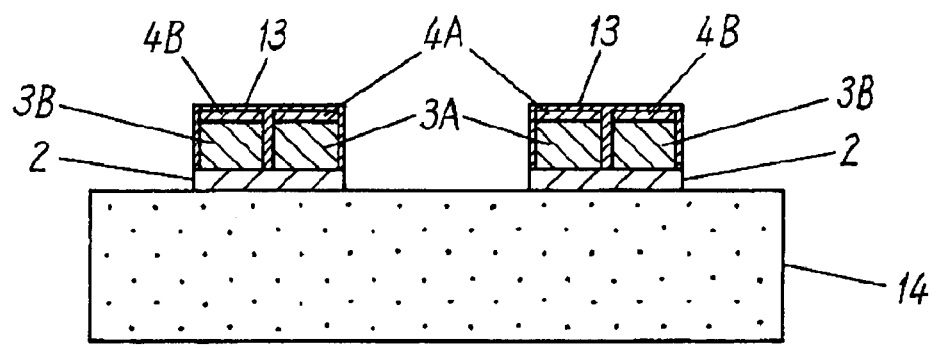
FIG. 6 is a sectional view taken along line 2—2 of FIG. 1, for illustrating the processes of manufacturing the angular velocity sensor of Embodiment 1.
Figure 7:
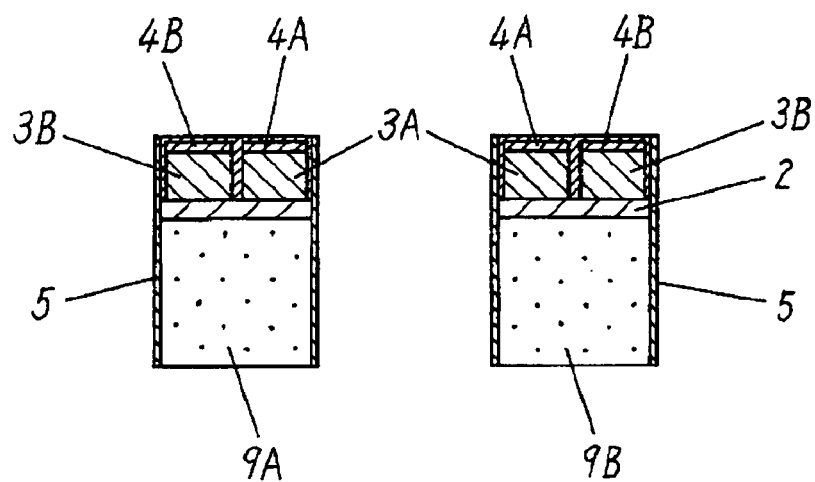
FIG. 7 is a sectional view taken along line 2—2 of FIG. 1, for illustrating the processes of manufacturing the angular velocity sensor of Embodiment 1.

Then, as shown in FIG. 6, resist mask 13 is used consequently to dry-etch silicon substrate 14 with etching gas including a first gas for facilitating this etching and a second gas for suppressing the etching. The first gas, which may be $SF_6$ or $CF_4$, facilitates the etching not only in a depth direction but also in a lateral direction. Thus, the second gas, such as $CHF_3$ or C4F8, for suppressing the etching is mixed with the first gas and forms protective film 5 made of carbon fluoride polymer on an etched lateral surface. The dry-etching therefore can proceed only downward. As a result, as shown in FIG. 7, silicon substrate 14 can be etched downward only. In order for the etched lateral surface to be perpendicular to a surface of substrate 14, substrate 14 is etched a little with the facilitating gas, and protective film 5 is formed a little with the suppressing gas. Then, these processes are repeated alternately, thus allowing a lateral surface to be perpendicular to the surface of substrate 14. More specifically, 130 sccm of $SF_6$ is supplied for generating plasma for 7 seconds, thereby etching substrate 14, then protective film 5 having a thickness of 0.01 μm is formed. These processes are repeated alternately about 180 times to form the lateral surface along a depth of 200 μm, thus providing the body 1 having the tuning-fork shape.

A magnitude to be etched of carbon fluoride polymer varies according to a type of etching gas more than silicon. Thus, an appropriate selection of the etching gas can etch only the silicon.

Protective film 5 is formed not only on lateral surfaces of arms 9A and 9B of body 1 but also on an under surface of substrate 14 with the suppressing gas during the etching process. However, protective film 5 formed on the under surface can be removed with the facilitating gas more easily than that on the lateral surfaces, thus allowing etching to proceed only downward. The etching continues until the under surface of silicon substrate 14 is etched, thus enabling body 1 having the tuning-fork shape to be cut from substrate 14. The etching preferably terminates when the substrate is etched with plasma generated by the suppressing gas. This ensures formation of protective film 5 made of carbon fluoride polymer on the lateral surfaces.

Figure 8:
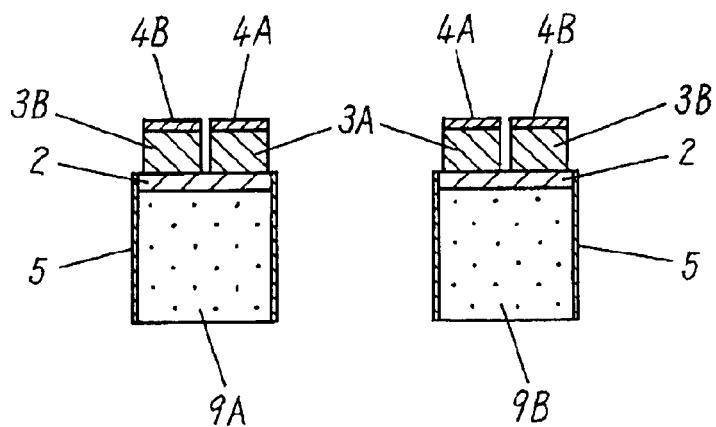
FIG. 8 is a sectional view taken along line 2—2 of FIG. 1, for illustrating the processes of manufacturing the angular velocity sensor of Embodiment 1.

Then, as shown in FIG. 8, resist film 13 is removed. Protective film 5 formed on resist film 13 is also removed simultaneously, while film 5 on lateral surfaces of body 1 made of silicon substrate is not removed.

Next, as shown in FIG. 9, body 1 having the tuning-fork shape is mounted in a packaging member, such as package 8. Then, an electrode coupled to outer electrode 11 exterior of package 8 is connected to electrode pad 6 on base 7 via wire 10. The packaging member is not limited to package 8, and may be a member having another shape, such as a board having a plate shape.

As shown in FIG. 10, arms 9A and 9B of body 1, which are mounted in package 8, float in package 8. As shown in FIG. 11, while body 1 mounted in package 8 is put into etching apparatus 15, the resonance frequency in detecting direction 52 deflected by Coriolis force is measured with measuring device 16. Then, as shown in FIG. 12, xenon-fluoride ($XeF_2$) gas is introduced from gas-inlet 17, so that only the under surface of body 1 where silicon is exposed is etched. This etching lowers gradually the resonance frequency in detecting direction 52. The resonance frequency is measured and fed back to the etching, thus allowing the gap frequency, i.e. the difference between the resonance frequency and the driving frequency to be equal to a predetermined value. When the resonance frequency reaches the predetermined value, supply of $XeF_2$ gas stops.

Since the lateral surfaces of body 1 having the tuning-fork shape is protected by protective film 5, the lateral surfaces are not etched, and the resonance frequency of the vibration due to driving in the driving direction does not change. The upper surface of body 1 is covered with lower electrode 2, piezoelectric member 3, and upper electrode 4, so that the upper surface cannot be etched.

Exemplary Embodiment 2

Figure 14:
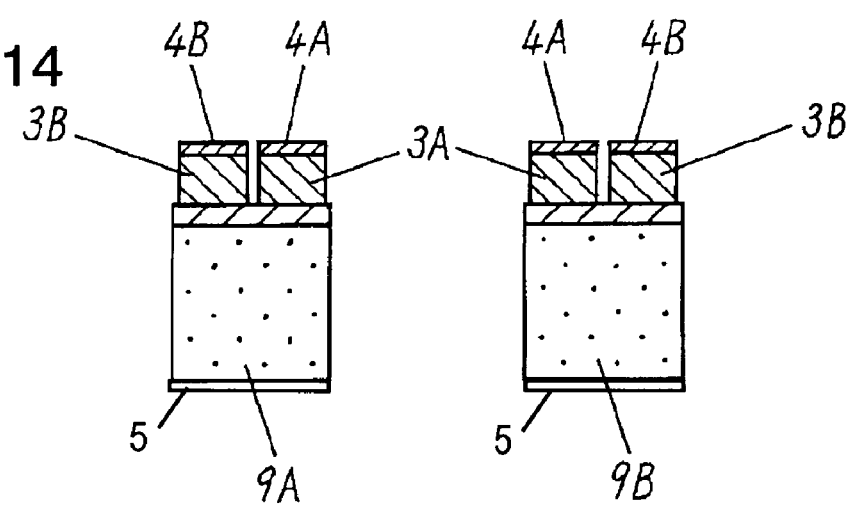
FIG. 14 is a sectional view taken along line 2—2 of FIG. 1, for illustrating processes of manufacturing an angular velocity sensor of Embodiment 2.

FIG. 14 is a sectional view of a body of an angular velocity sensor in accordance with Exemplary Embodiment 2 of the present invention. The sensor, differently from that of Embodiment 1, has a protective film made of carbon-fluoride polymer formed on an under surface of the body instead of a lateral surface before etching with xenon fluoride gas, as shown in FIG. 14. The protective film causes the xenon fluoride gas to etch exclusively silicon of a lateral surface of the body. As a result, only a resonance frequency in a driving direction decreases according to progress of the etching. This allows a gap frequency between resonant frequencies of a driving direction and a detecting direction to be adjusted.

Exemplary Embodiment 3

Figure 15:
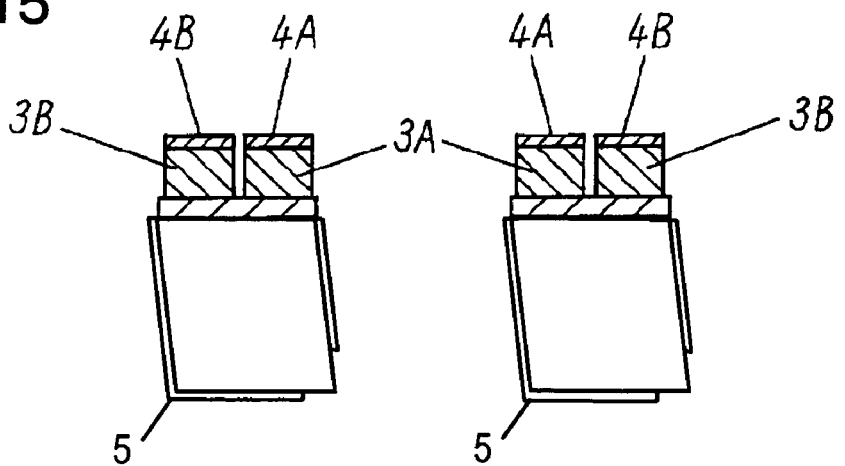
FIG. 15 is a sectional view taken along line 2—2 of FIG. 1, for illustrating processes of manufacturing an angular velocity sensor of Embodiment 3.

FIG. 15 is a sectional view of a body of an angular velocity sensor in accordance with Exemplary Embodiment 3 of the present invention. The sensor, differently from those of Embodiments 1 and 2, has a protective film made of carbon fluoride polymer formed not only on a lateral surface or an under surface of the body, but also on portions of both the lateral surface and the under surface. Portions of corners of the body are exposed, as shown in FIG. 15. In FIG. 15, the body may have a cross-section having a parallelogram shape, and have corners having acute-angled sections exposed.

This structure allows xenon fluoride gas to etch these exposed corners exclusively. In the body having the cross section having the parallelogram shape, respective vibrations in a driving direction and a detecting direction may be coupled with each other, however, the foregoing structure can cancel this coupling.

In the method of manufacturing the resonant device according to the embodiments of the present invention, a body is etched while a resonance frequency in a detecting direction is measured, thereby causing the resonance frequency to be adjusted to a predetermined value accurately. Further, etching with xenon-fluoride gas does not require generating plasma, thus allowing the resonance frequency to be accurately measured without influence of noise caused by the plasma.

INDUSTRIAL APPLICABILITY

In a method of manufacturing a resonant device, the device is etched accurately in its thickness direction while its resonance frequency is measured, thus causing a gap frequency of the resonant device to be adjusted to a predetermined value.

The invention claimed is:

1. A method of manufacturing a resonant device, comprising:
   forming a body that includes
   (i) a silicon substrate having an upper surface, an under surface, and lateral surfaces,
   (ii) a piezoelectric layer over said upper surface of said silicon substrate,
   (iii) an electrode layer over said upper surface of said silicon substrate, and
   (iv) protective films on said lateral surfaces of said silicon substrate, respectively; then
   measuring a resonance frequency of said body in a direction from said under surface to said upper surface of said silicon substrate; and
   etching said under surface of said silicon substrate by an amount according to said resonance frequency as measured.

2. The method according to claim 1, wherein said protective films each comprise a carbon fluoride polymer.

3. The method according to claim 1, wherein
   etching said under surface of said silicon substrate comprises dry-etching said under surface with $XeF_2$ gas.

4. The method according to claim 1, wherein
   said body has a tuning-fork shape.

5. The method according to claim 1, wherein
   forming said body includes etching material, that is to form said silicon substrate, with a first gas for facilitating etching and a second gas for suppressing etching.

6. The method according to claim 5, wherein
   etching said material with a first gas and a second gas comprises etching said material with a mixture of said fist and second gases.

7. The method according to claim 5, wherein said first gas comprises $SF_6$, and said second gas comprises one of $C_4F_8$ and $CHF_3$.

8. The method according to claim 1, wherein
   measuring a resonance frequency of said body in a direction from said under surface to said upper surface of said silicon substrate comprises measuring said resonance frequency during the etching of said under surface of said silicon substrate.

9. The method according to claim 8, further comprising:
stopping the etching of said under surface of said silicon substrate when said resonance frequency as measured becomes equal to a predetermined value.

10. The method according to claim 8, further comprising:
mounting said body to a packaging member,
wherein measuring said resonance frequency of said body comprises measuring said resonance frequency of said body while said body is mounted to said packaging member.

11. A method of manufacturing a resonant device, comprising:
forming a body that includes
(i) a silicon substrate having an upper surface, an under surface, and lateral surfaces,
(ii) a piezoelectric layer over said upper surface of said silicon substrate,
(iii) an electrode layer over said upper surface of said silicon substrate, and
(iv) protective films on lateral surfaces of said silicon substrate, respectively; then
measuring a resonance frequency of said body in a direction from said under surface to said upper surface of said silicon substrate while etching said silicon substrate; and
controlling an amount of said silicon substrate that is etched according to said resonance frequency as measured.

12. The method according to claim 11, wherein
etching said silicon substrate comprises dry-etching said silicon substrate with $XeF_2$ gas.

13. The method according to claim 11, wherein
controlling an amount of said silicon substrate that is etched according to said resonance frequency as measured comprises stopping the etching of said silicon substrate when said resonance becomes equal to a predetermined value.

14. The method according to claim 11, further comprising:
mounting said body to a packaging member,
wherein measuring said resonance frequency of said body comprises measuring said resonance frequency of said body while said body is mounted to said packaging member.

15. The method according to claim 11, wherein
said body has a tuning-fork shape.

16. The method according to claim 11, wherein
etching said silicon substrate comprises etching said under surface of said silicon substrate.

17. The method according to claim 11, wherein
etching said silicon substrate comprises etching a corner of said silicon substrate.

18. The method according to claim 11, wherein
forming said body includes etching material, that is to form said silicon substrate, with a first gas for facilitating etching and a second gas for suppressing etching.

19. The method according to claim 18, wherein
etching said material with a first gas and a second gas comprises etching said material with a mixture of said first and second gases.

20. The method according to claim 18, wherein
said first gas comprises $SF_6$, and said second gas comprises one of $C_4F_8$ and $CHF_3$.

* * * * *

UNITED STATES PATENT AND TRADEMARK OFFICE
CERTIFICATE OF CORRECTION

| | |
|---|---|
| PATENT NO. | : 7,083,740 B2 |
| APPLICATION NO. | : 10/494640 |
| DATED | : August 1, 2006 |
| INVENTOR(S) | : Masaya Nakatani et al. |

Page 1 of 1

It is certified that error appears in the above-identified patent and that said Letters Patent is hereby corrected as shown below:

In column 6, line 54, please replace "said fist and" with --said first and--.
In column 6, line 55, please replace "wherein said first" with
--wherein
   said first--.

Signed and Sealed this

Thirtieth Day of January, 2007

JON W. DUDAS
*Director of the United States Patent and Trademark Office*